United States Patent
Inoue et al.

(10) Patent No.: US 7,361,030 B2
(45) Date of Patent: Apr. 22, 2008

(54) MOUNTING STRUCTURE OF HIGH FREQUENCY APPARATUS

(75) Inventors: Daisuke Inoue, Fukushima-ken (JP); Shigetomo Chiba, Fukushima-ken (JP); Satoshi Iimure, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/388,134

(22) Filed: Mar. 22, 2006

(65) Prior Publication Data

US 2006/0240689 A1 Oct. 26, 2006

(30) Foreign Application Priority Data

Apr. 21, 2005 (JP) .............................. 2005-124281

(51) Int. Cl.
*H01R 12/00* (2006.01)
(52) U.S. Cl. .................................................. 439/76.1
(58) Field of Classification Search ............... 439/76.1, 439/607–610; 361/818, 752, 800, 796, 799
See application file for complete search history.

(56) References Cited

U.S. PATENT DOCUMENTS

| | | | | |
|---|---|---|---|---|
| 4,325,103 A | * | 4/1982 | Ito et al. ..................... | 361/816 |
| 5,159,537 A | * | 10/1992 | Okano ......................... | 361/816 |
| 6,011,700 A | * | 1/2000 | Matsuzaki ................... | 361/816 |
| 6,118,672 A | * | 9/2000 | Yamauchi et al. .......... | 361/818 |
| 6,388,892 B1 | | 5/2002 | Maeda | |

FOREIGN PATENT DOCUMENTS

JP 2908967 4/1999

\* cited by examiner

*Primary Examiner*—J. F. Duverne
(74) *Attorney, Agent, or Firm*—Beyer Law Group LLP

(57) ABSTRACT

In a mounting structure of a high frequency apparatus, in an outer circumference around terminals connected to a mother board, an enclosed portion, which is brought into contact with the mother board and is enclosed by a ring-shaped convex portion provided in a cover, or an enclosed portion, which is brought into contact with the mother board and is enclosed in a ring shape by a convex portion provided in the cover and extending portions from the frame, are provided. The terminals are electrically shielded by the enclosed portion. Therefore, when a high frequency apparatus is mounted on the mother board, interfering electric waves are prevented from entering into the terminals, and thus favorable performance is obtained.

3 Claims, 4 Drawing Sheets

MOUNTING STRUCTURE OF HIGH FREQUENCY APPARATUS

BACKGROUND OF THE INVENTION

1. Field of the Invention

The present invention relates to a mounting structure of a high frequency apparatus which is suitable for a television tuner or the like.

2. Description of the Related Art

FIG. 6 is a side view showing a mounting structure of a high frequency apparatus according to the related art. FIG. 7 is a bottom view of a high frequency apparatus in the related art mounting structure of a high frequency apparatus. The configuration of a mounting structure of a high frequency apparatus according to the related art will be described with reference to FIGS. 6 and 7. A box-shaped frame 51 is formed of a metal plate, on which two covers 52 are mounted so as to cover two opposing open surfaces of the frame 51.

In the frame 51, though not shown, a circuit board having electronic components mounted thereon is disposed, on which a plurality of terminals 53 are mounted in a line. The terminals 53 protrude downward from a wall portion 51a located at a lower surface of the frame 51. In addition, two extending portions 51b, which protrude in the same direction as the terminals 53 and face each other, are provided in the frame 51. As a result, a related art high frequency apparatus is formed.

In the related art high frequency apparatus having the above-described configuration, as shown in FIG. 6, the extending portions 51b and the terminals 53 are inserted into holes (not shown) of a mother board 54 and mounted on conductive patterns (not shown), which are provided on the mother board 54, by soldering (for example, see Japanese Patent No. 2908967).

In the related art mounting structure of a high frequency apparatus, the two extending portions 51b disposed at a predetermined gap, and the terminals 53 disposed between the two extending portions 51b are mounted on the mother board 54. Accordingly, when a high frequency apparatus is mounted on the mother board 54, a space between the two extending portions 51b opens. And then, interfering electric waves enter into the terminals 53, thereby causing deterioration in performance.

SUMMARY OF THE INVENTION

It is an object of the invention to provide a mounting structure of a high frequency apparatus which prevent interfering electric waves from entering into terminals and has favorable performance In order to solve the above-described problems, according to a first aspect of the invention, a mounting structure of a high frequency apparatus includes a box-shaped frame that is formed of a metal plate and has an open surface, a cover that is formed of a metal plate and is mounted on the frame so as to cover the open surface, a circuit board that is disposed in the frame and has electronic components mounted on wiring patterns, a plurality of terminals that are connected to the wiring patterns and protrude outside the frame, and a mother board that has conductive patterns to be connected to the terminals. In an outer circumference around the terminals, an enclosed portion, which is brought into contact with the mother board and is enclosed by a ring-shaped convex portion provided in the cover, or an enclosed portion, which is brought into contact with the mother board and is enclosed in a ring shape by a convex portion provided in the cover and extending portions from the frame, are provided. The terminals connected to the conductive patterns of the mother board are electrically shielded by the enclosed portion.

Further, according to a second aspect of the invention, it is preferable that the ring-shaped convex portion provided in the cover have a swelled portion provided in an outer circumference of the cover or its periphery, and the terminals protruding from the cover be electrically shielded by the ring-shaped swelled portion.

In addition, according to a third aspect of the invention, it is preferable that the convex portion provided in the cover have a swelled portion provided on one side of the cover, the extending portions provided in the frame be formed to extend over the wall portion of the frame, from which the terminals protrude, in the same direction as the swelled portion, and the terminals protruding from the wall portion be electrically shielded by the enclosed portion having the swelled portion and the extending portions.

Further, according to a fourth aspect of the invention, it is preferable that the frame has one open surface and three extending portions disposed in a U shape, the cover covering the open surface has a swelled portion protruding in the same direction as the extending portions, and the enclosed portion is formed by the three extending portions and one swelled portion.

According to a fifth aspect of the invention, it is preferable that the frame has two open surfaces facing each other and two extending portions disposed between the two open surfaces so as to face each other, each of two covers covering the two open surfaces has a swelled portion protruding between the two extending portions, and the enclosed portion is formed by the two extending portions and the two swelled portions.

DESCRIPTION OF THE PREFERRED EMBODIMENT

Figure 1:
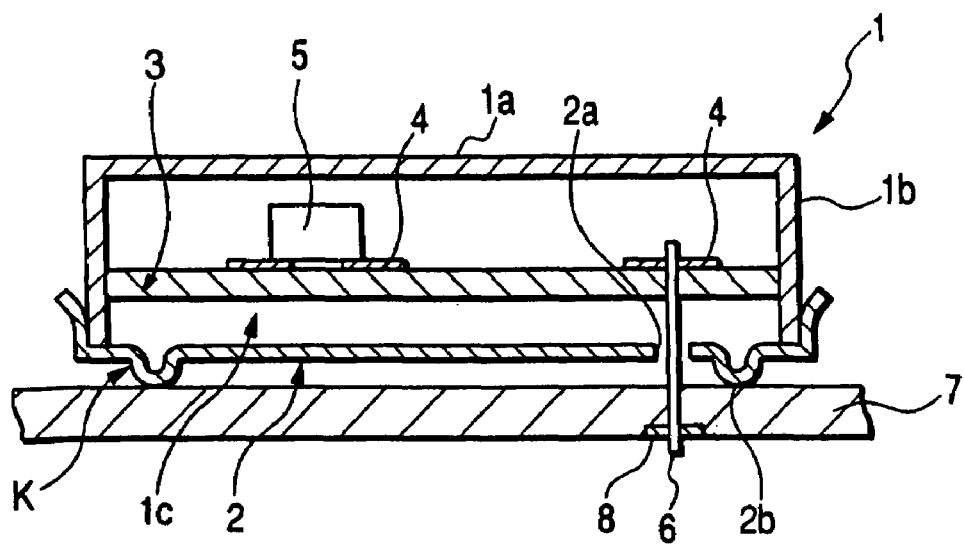
FIG. 1 is a cross-sectional view showing essential parts of a mounting structure of a high frequency apparatus according to a first embodiment of the invention.
Figure 2:
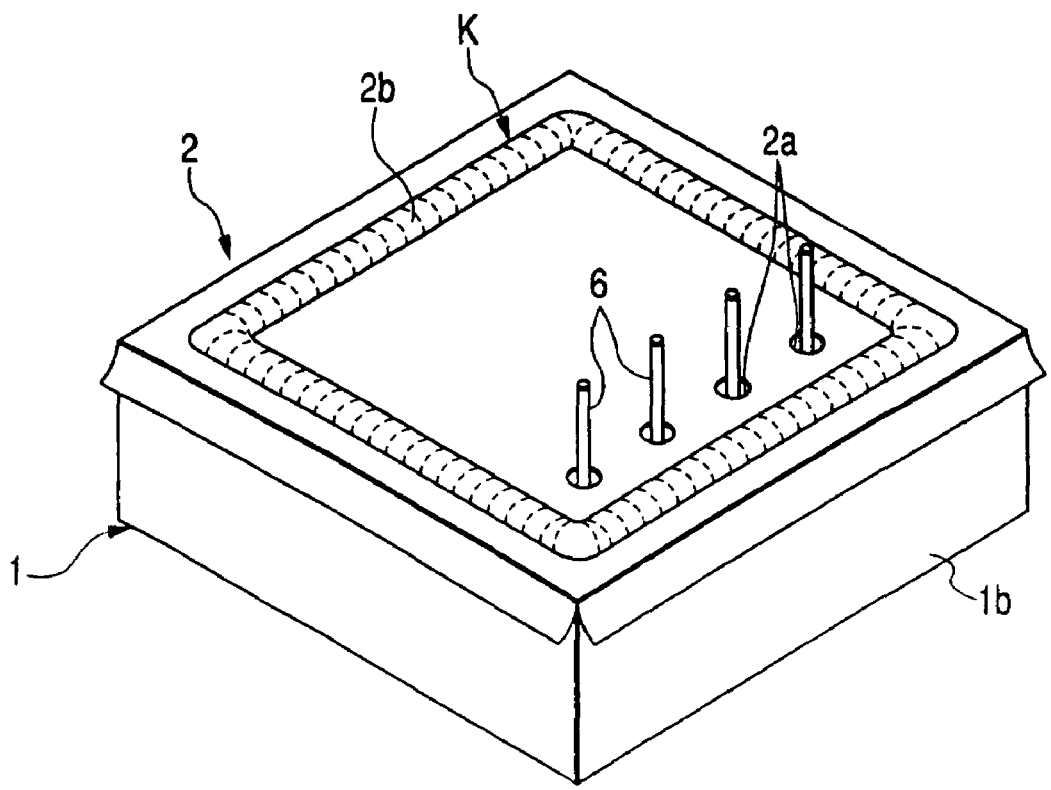
FIG. 2 is a perspective view showing a state in which a high frequency apparatus used in the mounting structure of a high frequency apparatus according to the first embodiment of the invention is turned over.
Figure 3:
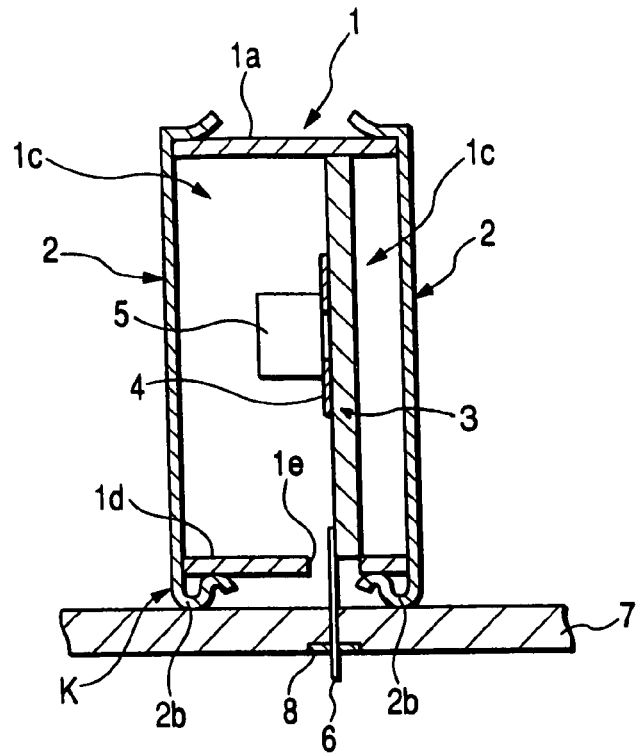
FIG. 3 is a cross-sectional view showing essential parts of a mounting structure of a high frequency apparatus according to a second embodiment of the invention.
Figure 4:
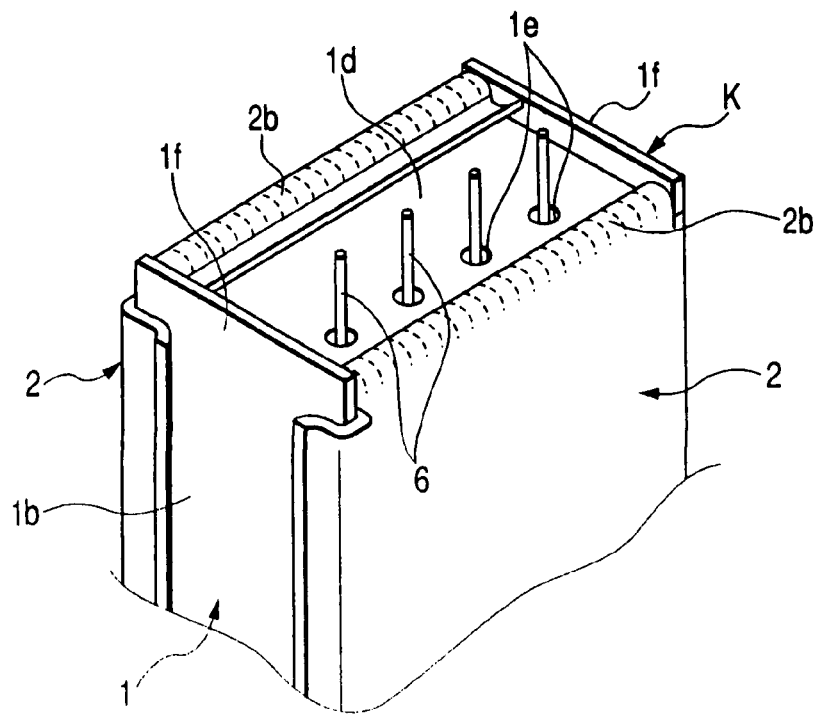
FIG. 4 is a perspective view showing essential parts in a state in which a high frequency apparatus used in the mounting structure of a high frequency apparatus according to the second embodiment of the invention is turned over.
Figure 5:
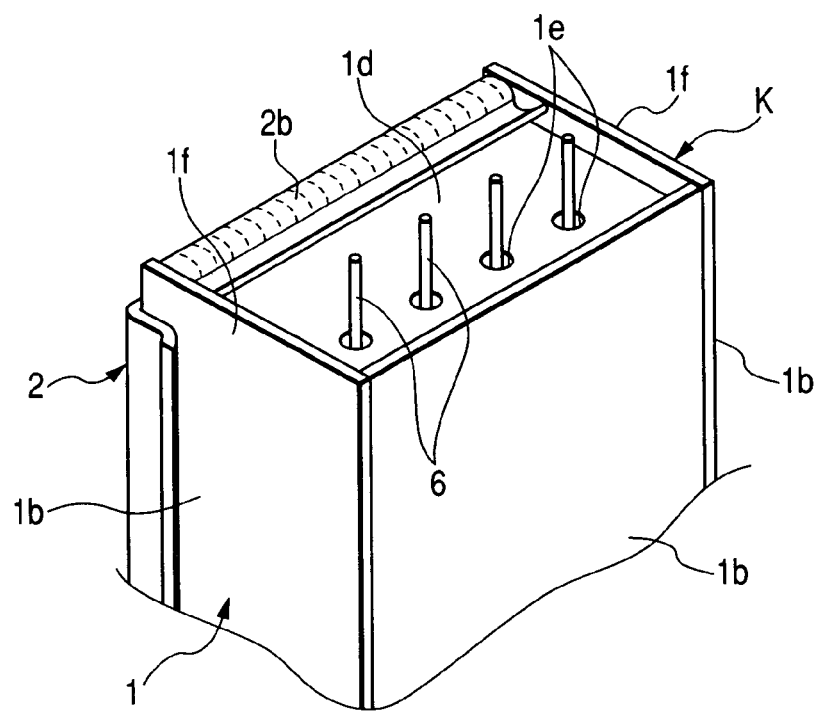
FIG. 5 is a perspective view showing essential parts in a state in which a high frequency apparatus used in a mounting structure of a high frequency apparatus according to a third embodiment of the invention is turned over.
Figure 6:
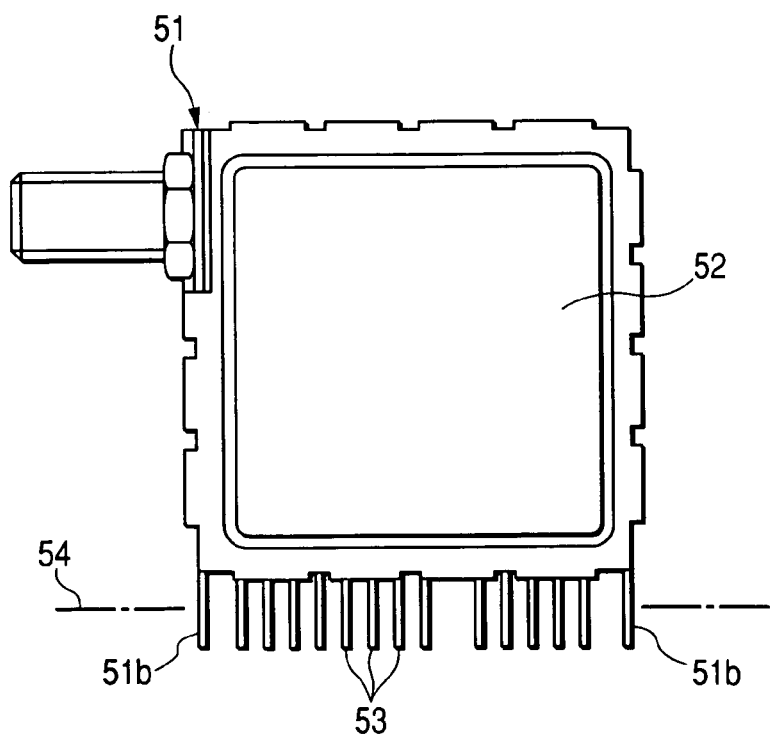
FIG. 6 is a side view showing a mounting structure of a high frequency apparatus according to the related art.
Figure 7:
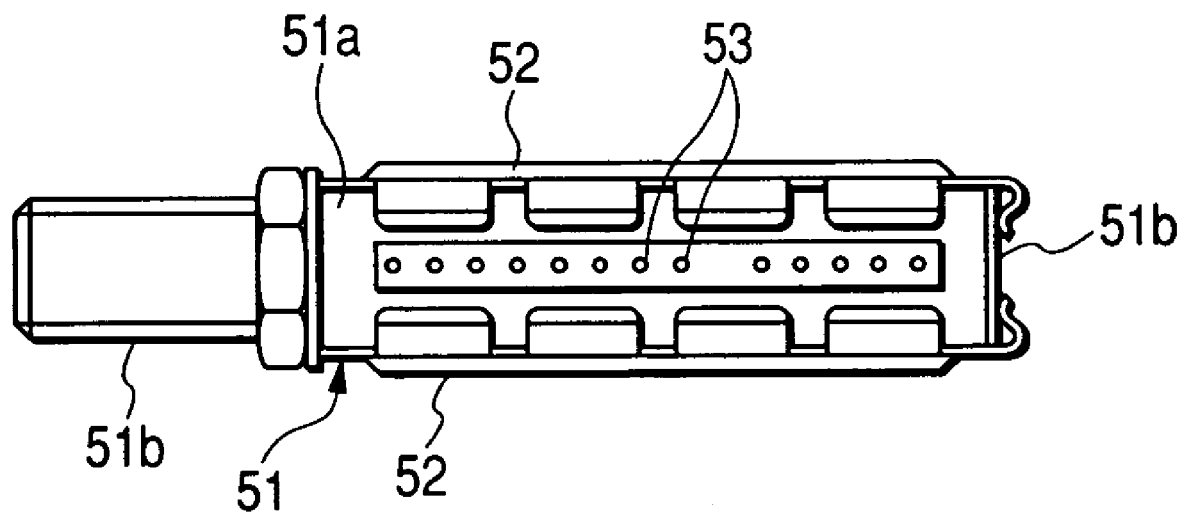
FIG. 7 is a bottom view showing a high frequency apparatus used in the mounting structure of a high frequency apparatus according to the related art.

A mounting structure of a high frequency apparatus according to the invention will be described with reference to the accompanying drawings. FIG. 1 is a cross-sectional view showing essential parts of a mounting structure of a high frequency apparatus according to a first embodiment of the invention. FIG. 2 is a perspective view showing a state in which a high frequency apparatus used in the mounting structure of a high frequency apparatus according to the first embodiment of the invention is turned over. FIG. 3 is a cross-sectional view showing essential parts of a mounting structure of a high frequency apparatus according to a second embodiment of the invention. FIG. 4 is a perspective view showing essential parts in a state in which a high frequency apparatus used in the mounting structure of a high frequency apparatus according to the second embodiment of the invention is turned over. FIG. 5 is a perspective view showing essential parts in a state in which a high frequency apparatus used in a mounting structure of a high frequency apparatus according to a third embodiment of the invention is turned over.

Next, the configuration of a mounting structure of a high frequency apparatus according to a first embodiment of the invention will be described with reference to FIGS. 1 and 2. A box-shaped frame 1 formed of a metal plate has a wall portion 1a serving as an upper wall, four wall portions 1b serving as side walls bent from the periphery of the wall portion 1a downward, and an open surface 1c facing the wall portion 1a.

A cover 2 formed of a metal plate has a plurality of through holes 2a provided in a line, and a ring-shaped convex portion 2b provided to enclose around the through holes 2a. The convex portion 2b has a swelled portion which is provided in an outer circumference of the cover 2 or its periphery and protrudes downward.

A circuit board 3 has wiring patterns 4, on which electronic components 5 of several types are mounted so as to form a desired electrical circuit. A plurality of terminals 6 disposed in a line are mounted on the circuit board 3 in a state of being connected to the wiring patterns 4.

The circuit board 3 having such a configuration is mounted on the frame 1 by a suitable unit, the terminals 6 of the circuit board 3 disposed in the frame 1 are located close to the open surface 1c and protrude outside the frame 1 through the through holes 2a of the cover 2. As a result, a high frequency apparatus of the invention is formed.

With this configuration, in an outer circumference around the terminals 6 protruding from the frame 1 through the through holes 2a of the cover 2, an enclosed portion K, which is enclosed by the ring-shaped convex portion 2b serving as a swelled portion, is formed.

In the high frequency apparatus having the above-described configuration, as shown in FIG. 1, the terminals 6 are inserted into a mother board 7 and then are connected to conductive patterns 8 provided on the mother board 7 by soldering. Further, the top of the convex portion 2b is brought into contact with the mother board 7 while enclosing the outer circumference of the terminals 6. The enclosed portion K blocks a gap between the cover 2 and the mother board 7 while enclosing the terminals 6. And then, by the enclosed portion K, interfering electric waves are prevented from entering into the terminals 6.

Moreover, although the frame 1 in which the wall portion 1a serving as the upper wall is provided has been described, an open surfaces may be provided at a place of the wall portion 1a and covered by another cover. Further, the frame 1 may be mounted on the conductive patterns 8 of the circuit board 3 by soldering.

Further, FIGS. 3 and 4 show a mounting structure of a high frequency apparatus according to a second embodiment of the invention. In the second embodiment, a box-shaped frame 1 has a wall portion 1a serving as an upper wall, two opposing wall portions 1b serving as side walls bent from two sides of the wall portion 1a downward, a wall portion 1d serving as a lower wall, through holes 1e that are provided in the wall portion 1d in a line, two open surfaces 1c that are provided to face each other at positions of two side surfaces, and extending portions 1f that protrude downward from the two wall portions 1b serving as the side walls over the wall portion 1d serving as the lower wall.

Each of two covers 2 has convex portion 2b that is formed at its lower side. The convex portion 2b has a swelled portion that protrudes downward. The covers 2 are disposed so as to cover the open surfaces 1c located at the side surfaces. At this time, the convex portion 2b of each of the two covers 2 is located at the open surface between the two extending portions 1f.

Further, the terminals 6 mounted on the circuit board 3 protrude outside the frame 1 through the through holes 1e of the wall portion 1d serving as the lower wall. In an outer circumference around the terminals 6 protruding outside the frame 1 through the through holes 1e of the wall portion 1d, an enclosed portion K, which is enclosed by the two extending portion 1f and the two convex portions 2b serving as swelled portions, is formed.

In the high frequency apparatus having the above-described configuration, as shown in FIG. 3, the terminals 6 are inserted into the mother board 7 and then are connected to the conductive patterns 8 provided on the mother board 7 by soldering. The lower ends of the two extending portions 1f and the tops of the two convex portions 2b are brought into contact with the mother board 7 while enclosing the outer circumference around the terminals 6. The enclosed portion K blocks the gap between the wall portion 1d serving as the lower wall and the mother board 7 while enclosing the terminals 6. And then, by the enclosed portion K, interfering electric waves are prevented from entering into the terminals 6.

Other parts are the same as those in the first embodiment. The same parts as those in the first embodiment are represented by the same reference numerals, and the descriptions thereof will be omitted.

FIG. 5 shows a mounting structure of a high frequency apparatus according to a third embodiment of the invention. According to this embodiment, one of the two covers 2 in the second embodiment is removed, and a wall portion 1b serving as a side wall of the frame 1 is provided at a position where the cover 2 is removed. In the wall portions 1b, extending portions 1f protruding downward are provided. And then, in an outer circumference around the terminals 6 which are mounted on the circuit board 3 and protrude from the through holes 1e of the wall portion 1d, an enclosed portion K, which is enclosed by the three extending portions 1f in a U shape and one convex portion 2b serving as a swelled portion, is formed.

Further, in the third embodiment, though not shown, the terminals 6 of the high frequency apparatus are inserted into the mother board 7 and then are connected to the conductive patterns 8 provided on the mother board 7 by soldering. The lower ends of the three extending portions 1f in the U shape and the top of the convex portion 2b are brought into contact with the mother board 7 while enclosing the outer circumference around the terminals 6. Further, the enclosed portion K blocks a gap between the wall portion 1d serving as the lower wall and the mother board 7 while enclosing the terminals 6. By the enclosed portion K, interfering electric waves are prevented from entering into the terminals.

Other parts are the same as those in the second embodiment. The same parts as those in the second embodiment are represented by the same reference numerals and the descriptions thereof will be omitted.

The mounting structure of a high frequency apparatus according to the invention includes the frame, the cover that covers the open surface of the frame, the circuit board that is disposed in the frame, the plurality of terminals that are connected to the wiring patterns of the circuit board and protrude outside the frame, and the mother board that has the conductive patterns connected to the terminals. In the outer circumference around the terminals, the enclosed portion, which is brought into contact with the mother board and is enclosed by the ring-shaped convex portion provided in the cover, or the enclosed portion, which is brought into contact with the mother board and is enclosed in the ring shape by the convex portion provided in the cover and extending portions from the frame, are provided. The terminals are electrically shielded by the enclosed portion. Therefore, when the high frequency apparatus is mounted on the mother board, by the enclosed portion, the interfering electric waves are prevented from entering into the terminals, and thus favorable performance is obtained.

Further, the ring-shaped convex portion provided in the cover has the swelled portion in an outer circumference of the cover or its periphery, and the terminals protruding from the cover is electrically shielded by the ring-shaped swelled portion. Therefore, the enclosed portion is formed without using additional parts and thus the configuration is simplified. Further, the invention is suitable for a case in which the high frequency apparatus is disposed in a face-down manner with respect to the mother board.

The convex portion provided in the cover has the swelled portion provided at one side of the cover and the extending portions of the frame are formed to extend over the wall portion of the frame, from which the terminals protrude, in the same direction as the swelled portion. The terminal protruding from the wall portion is electrically shielded by the enclosed portion, which has the swelled portion and the extending portions. Therefore, the enclosed portion is formed without using additional parts and the configuration is simplified. Further, the invention is suitable for a case in which the high frequency apparatus is disposed in an upright manner with respect to the mother board.

The frame has one open surface and the three extending portions in the U shape, the cover covering one open surface has the swelled portion protruding in the same direction as the extending portions, and the enclosed portion is formed by the three extending portions and one swelled portion. Therefore, the invention is suitable for a case in which one cover is used and the high frequency apparatus is disposed in an upright manner with respect to the mother board.

The frame has the two open surfaces facing each other and the two extending portions between the open surfaces to face each other, each of two covers covering the two open surfaces has the swelled portion protruding between the extending portions, and the enclosed portion is formed by the two extending portions and the two swelled portions. Therefore, the invention is suitable for a case in which two covers are used, and the high frequency apparatus is disposed in an upright manner with respect to the mother board.

The invention claimed is:

1. A mounting structure of a high frequency apparatus comprising:
    a box-shaped frame that is formed of a metal plate and has an open surface;
    a cover that is formed of a metal plate and is mounted on the frame so as to cover the open surface;
    a circuit board that is disposed in the frame and has electronic parts mounted on wiring patterns;
    a plurality of terminals that are connected to the wiring patterns and protrude outside the frame; and
    a mother board that has conductive patters connected to the terminals,
    wherein, in an outer circumference around the terminals, an enclosed portion, which is brought into contact with the mother board and is enclosed by a ring-shaped convex portion provided in the cover, or an enclosed portion, which is brought into contact with the mother board and is enclosed in a ring shape by a convex portion provided in the cover and extending portions from the frame, are provided,
    wherein the terminals connected to the conductive patterns of the mother board are electrically shielded by the enclosed portion, and
    wherein the convex portion provided in the cover has a swelled portion that is provided at one side of the cover, the extending portions provided in the frame are formed to extend over the wall portion, from which the terminals protrude, in the same direction as the swelled portion, and the terminals protruding from the wall portion are electrically shielded by the enclosed portion having the swelled portion and the extending portions.

2. A mounting structure of a high frequency apparatus comprising:
    a box-shaped frame that is formed of a metal plate and has an open surface;
    a cover that is formed of a metal plate and is mounted on the frame so as to cover the open surface;
    a circuit board that is disposed in the frame and has electronic parts mounted on wiring patterns;
    a plurality of terminals that are connected to the wiring patterns and protrude outside the frame; and
    a mother board that has conductive patters connected to the terminals,
    wherein, in an outer circumference around the terminals, an enclosed portion, which is brought into contact with the mother board and is enclosed by a ring-shaped convex portion provided in the cover, or an enclosed portion, which is brought into contact with the mother board and is enclosed in a ring shape by a convex portion provided in the cover and extending portions from the frame, are provided,
    wherein the terminals connected to the conductive patterns of the mother board are electrically shielded by the enclosed portion,
    wherein the convex portion provided in the cover has a swelled portion that is provided at one side of the cover, the extending portions provided in the frame are formed to extend over the wall portion, from which the terminals protrude, in the same direction as the swelled portion, and the terminals protruding from the wall portion are electrically shielded by the enclosed portion having the swelled portion and the extending portions, and
    wherein the frame has one open surface and three extending portions disposed in a U shape, the cover covering the open surface has a swelled portion protruding in the same direction as the extending portions, and the enclosed portion is formed by the three extending portions and one swelled portion.

3. A mounting structure of a high frequency apparatus comprising:

a box-shaped frame that is formed of a metal plate and has an open surface;
a cover that is formed of a metal plate and is mounted on the frame so as to cover the open surface;
a circuit board that is disposed in the frame and has electronic parts mounted on wiring patterns;
a plurality of terminals that are connected to the wiring patterns and protrude outside the frame; and
a mother board that has conductive patters connected to the terminals,
wherein, in an outer circumference around the terminals, an enclosed portion, which is brought into contact with the mother board and is enclosed by a ring-shaped convex portion provided in the cover, or an enclosed portion, which is brought into contact with the mother board and is enclosed in a ring shape by a convex portion provided in the cover and extending portions from the frame, are provided,
wherein the terminals connected to the conductive patterns of the mother board are electrically shielded by the enclosed portion,
wherein the convex portion provided in the cover has a swelled portion that is provided at one side of the cover, the extending portions provided in the frame are formed to extend over the wall portion, from which the terminals protrude, in the same direction as the swelled portion, and the terminals protruding from the wall portion are electrically shielded by the enclosed portion having the swelled portion and the extending portions, and
wherein the frame has two open surfaces facing each other and two extending portions disposed between the two open surfaces so as to face each other, each of two covers covering the two open surfaces has a swelled portion protruding between the two extending portions, and the enclosed portion is formed by the two extending portions and the two swelled portions.

* * * * *